United States Patent [19]

Deutsch

[11] Patent Number: 4,570,206
[45] Date of Patent: Feb. 11, 1986

[54] ELECTRICALLY CONTROLLED OPTICAL DISPLAY APPARATUS FOR AN ARTICLE OF CLOTHING

[76] Inventor: Claude Deutsch, 50 rue Jules Blondeau, 51160 Ay, France

[21] Appl. No.: 600,503

[22] Filed: Apr. 16, 1984

Related U.S. Application Data

[63] Continuation-in-part of Ser. No. 363,807, Mar. 31, 1982, abandoned.

[30] Foreign Application Priority Data

Feb. 24, 1982 [FR] France .............................. 82 03015

[51] Int. Cl.⁴ ............................................. F21L 15/08
[52] U.S. Cl. .................................... 362/103; 362/106; 362/184; 362/252; 362/800; 362/808; 2/185 R; 2/115
[58] Field of Search ............... 362/103, 104, 105, 106, 362/108, 184, 252, 800, 806, 389, 306; 2/122, 209.2, 247, 251, 185 R, 115; 24/17 B, 17 AP, 129 D, 300

[56] References Cited

U.S. PATENT DOCUMENTS

| | | | |
|---|---|---|---|
| 4,098,169 | 7/1978 | Gawlick et al. | 89/35 R |
| 4,308,572 | 12/1981 | Davidson et al. | 362/800 X |
| 4,480,293 | 10/1984 | Wells | 362/800 X |

FOREIGN PATENT DOCUMENTS 2497985  7/1982  France .............................. 362/103

Primary Examiner—Stephen C. Bentley
Assistant Examiner—John S. Maples
Attorney, Agent, or Firm—Andrus, Sceales, Starke & Sawall

[57] ABSTRACT

The invention relates to an electrically controlled optical display apparatus for embellishing or decorating a design on a garment. A removable display apparatus has lamps (4) and electrical connectors (8) disposed in a composite removable patch (3, 9, 10) on inside the garment. The lamps (4) project outside the garment and are held by elastic clamping members (12) surrounding the luminous heads of the lamps.

2 Claims, 4 Drawing Figures

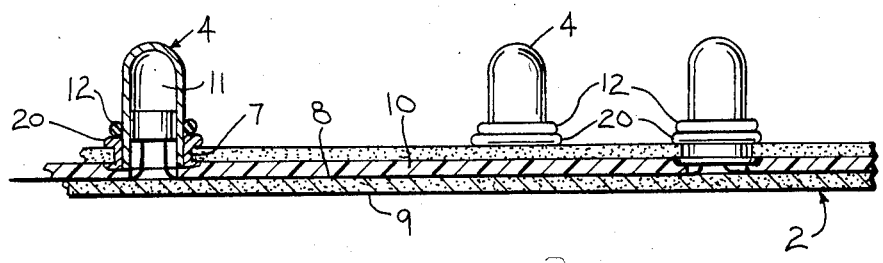
FIG. 2
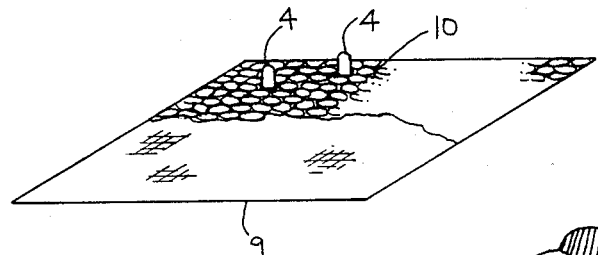
FIG. 4
FIG. 1
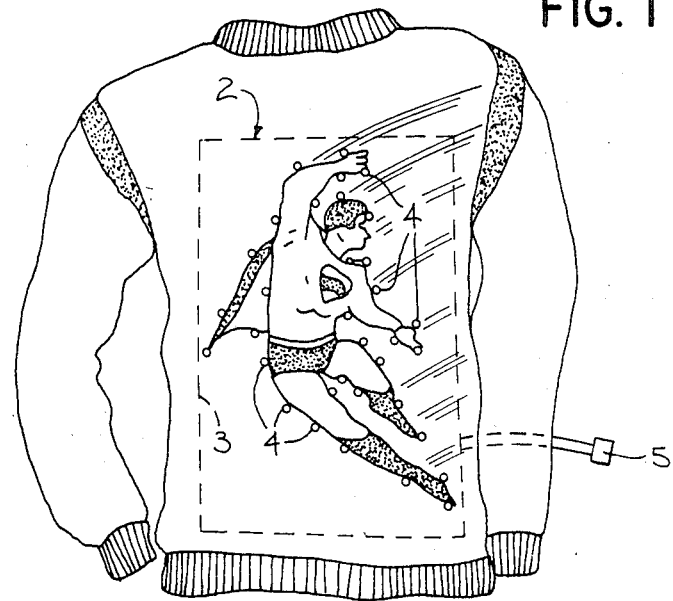
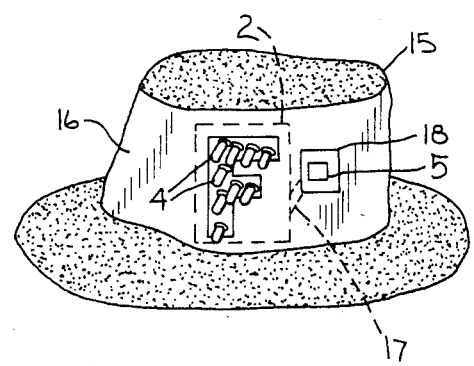
FIG. 3

ELECTRICALLY CONTROLLED OPTICAL DISPLAY APPARATUS FOR AN ARTICLE OF CLOTHING

The present application is a continuation-in-part application of U.S. Pat. application Ser. No. 363,807, filed Mar. 31, 1982 and now abandoned.

The present invention relates to electrically controlled optical display apparatus for embellishing or decorating the external appearance of a design on an article of clothing, such as a T-shirt, a sweat-shirt, a shirt, a hat or other garment, and comprising lamps, for example light emitting diodes, projecting out of the garment and connected in an electrical circuit with removable battery or other source of electrical energy.

In the field of clothing, garments are known, and especially T-shirts, sweat-shirts and similar garments, having a generally similar kind of display apparatus which produces a flashing or continuously illuminated design. Such a garment bears, generally on its front, a small device bearing small flashing lamps and comprising an integrated circuit or printed circuit board presenting a panel bearing the lamps and secured to the garment permanently by thermo-setting bonds. The lamps appear in holes in the garment.

However such garments present features which have considerable disadvantages:

the lamps and the associated circuit board are permanently fixed to the garment which presents serious problems for cleaning and up keep, especially washing since the circuit and lamps risk becoming unusable mechanically (parts of the circuit or the lamps being detached) or thermally (damage to components such as transistors) or electrically (short-circuits).

the integrated circuit or printed circuit is not repairable; if it malfunctions, the circuit cannot be changed, it is bonded to the garment, the whole garment must be replaced.

in this known apparatus, large designs cannot be illuminated since the circuit price is high and becomes prohibitive for a design which covers all the front or rear of a body garment, for example.

moreover, the circuit forms a rigid panel covering all the illuminated area and is therefore not suitable for securing to a flexible material fitting the wearer's body and can cause some discomfort for the wearer.

Accordingly, the object of the present invention is to avoid some or all of the above disadvantages, and the present invention provides an electrically controlled optical display apparatus for a garment comprising a plurality of electrical lamps for projecting out of the garment, a source of electrical power, and connector means for connecting said lamps with said source, characterised in that said apparatus comprises a patch to which said lamps and connectors are secured, said apparatus being removably attachable to the garment with said patch inside the garment by attachment means said attachment means including elastic clamping members detachably clampable onto the luminous heads of said lamps.

The display apparatus including lamps and connectors being removable, the garment can then be cleaned in the ordinary way, without risk of damage to the display apparatus. The elastic clamping members on the clamps provide a particularly simple and effective means for attaching the patch to the garment. The apparatus does not require a rigid structure to support the electrical connectors, which may comprise flexible conductors connecting the different members together, and hence can extend over a large area, as desired, and also can halve the cost of a garment with such optical display apparatus compared to garments with previously known opto-electrical displays.

In a preferred embodiment, said lamps comprise generally cylindrical elongate heads for projecting out of holes preformed in said garment and of diameters intermediate between the diameters of said heads and the size of said clamping members. The holes may have eyelets surrounding them. Thus, not only do the luminous heads of the lamps cooperate with the clamping members in attaching the apparatus to the garment, but also the elongate heads provide an increased luminous effect, whether continuous or flashing, emphasizing the design, which may be a more or less stylised name, on the clothing.

The clamping member may comprise rubber rings.

In a preferred arrangement, said patch comprises two panels of flexible material secured together, and between which are secured the bases of said lamps, and said connector means, said connector means comprising flexible electrical connectors. One panel is a mesh through which extends the lamps. The other panel has a smooth finish for lying next to the wearer.

Other features and advantages of the invention will appear from the following description given by way of non-limitative example with reference to the accompanying drawings, in which:

FIG. 1 is a front view of a sweat-shirt bearing a removable opto-electric display apparatus according to the invention;

FIG. 2 is a sectional view of an added patch provided with lamps and electrical connections fixed to a garment such as that of FIG. 1, in accordance with the invention;

FIG. 3 shows a variant in which an opto-electrical display apparatus in accordance with the invention is applied to a hat;

FIG. 4 is a perspective view showing details of the patch.

In FIG. 1 an article of clothing such as a sweat-shirt, pull-over or other garment, appears in front view, with an opto-electrical display apparatus 2 removably fixed to its in accordance with the invention. The display apparatus comprises essentially an added patch 3, in this case of rectangular shape disposed behind the front panel of the garment. Lamps 4, formed by light-emitting diodes ("LED's") which can be of different colours and connected by electrical connectors (see FIG. 2) to electronic components (not shown) of generally known type to form a flasher or other control circuit, are energised by a battery 5 indicated diagrammatically.

In the embodiment shown, the lamps 4 are disposed along the outer contour of a design representing a person, for example the hero of a comic strip. Naturally, the design could be a different representation attached to, bonded on or drawn on the material of the garment, with any desired shape, such as letters, a more or less stylistic name, or a combination of drawing of a person and a name, for example.

FIG. 2 shows, in transverse section, a view of the garment 1 fitted with an opto-electrical display apparatus 2, in accordance with the invention. The display apparatus comprises the lamps 4 passing through suitable sized holes 7 formed in the material of the garment 1. Holes 7 are surrounded by grommets or eyelets 20 that closely surround lamps 4 while allowing the lamps to easily slip through the eyelets. Electrical connectors 8 shown diagrammatically as simple flexible electrical cables connect the lamps 4 to the battery 5 and the electronic components (not shown) which provide sequential or cyclical flashing or continuous lighting of the lamps under the energisation of the battery. Moreover, the parts of the display apparatus are inserted in a composite flexible structure comprising two patches 9, 10 of cloth or plastics material which are sewn together to sandwich between them the electrical connectors 8 the electrical components (not shown) and the bases of the lamps 4. Patch 10 is formed out of mesh material, as shown in FIG. 4, through which lamps 4 extend. Patch 9 is formed of a material having a smooth finish that is comfortable when placed next to the body of the wearer.

The lamps 4, which are preferably LED's, comprise heads 11 of elongate cylindrical shape with a round end the height of which is such that they project substantially beyond the surface of the garment 1 through the holes 7 and eyelets 20 preformed in the garment.

In the embodiment of FIGS. 1 and 2, the complete display appartus 2, including the electrical connector 8 and the lamps 4, disposed in the flexible removable composite cloth patch 9, 10 applied to the inside face of the garment 1 is fixed to and against the garment by means of elastic clamping members 12 push fitted on each of the cylindrical luminous heads of the lamps 4 and comprising toric rings (in the form of "0"-rings) whose relaxed inner diameter is slightly less than the outer diamter of the heads of the lamps. Preferably the clamping members are made of rubber, which provides a sufficient coefficient of friction between the clamping members and the material of the heads of the lamps to prevent them sliding thereon.

In FIG. 3, a variant usage of the opto-electrical display apparatus of the invention is shown, applied to a hat 15. The complete display apparatus 2 including the patch 9-10 is fixed to the upright part 16 of the hat 15 using the lamps 4 and the elastic clamp members 12 as fastenings. Moreover, the electrical connectors 8, comprising wires 17, connect with a battery 5 disposed for example in a small pocket 18 made in the hat 15.

When the battery 5 is connected up, the lamps 4 flash in succession, individually or in groups. Moreover, it is also possible to include in the electrical controls a microphone (not shown) sensitive to ambiant noise to actuate the flashing of the lamps 4 so that, for example, out of eight lamps, three light up for a weak sound, while all the lamps 4 light for a louder sound.

I claim:

1. An article of clothing having an illuminated display on a portion thereof comprising:

a garment having an inner surface, an outer surface, and a plurality of holes, said holes being selected in a pattern and surrounded by eyelets;

a first panel of flexible material secured to a second panel of flexible material to form a pouchlike patch, said first material being a mesh, said second material having a smooth finish;

a plurality of electrically illuminable members extending through the mesh of said first panel of flexible material in said selected pattern, said members having generally cylindrical elongate heads projecting from said first panel;

flexible connector means and energization means lying within said pouch-like patch, said connector means interconnecting said electrically illuminable members and connecting same to said energization means, said connector means being connectable to an electrical power source for said electrically illuminable members;

said electrically illuminable members extending through said eyelets in said garment from the inside to the outside so that a portion of the members extend above said outer surface and said first panel of said patch lies along said inner surface of said garment while said second panel is exposed to the wearer of the garment, said eyelets in said garment closely surrounding said members while allowing said members to easily slip through said eyelets; and a resilient ring having a diameter smaller than that of said members embracing each of said members on the portion extending above said outer surface, said rings abutting said eyelets of said garment for being the sole means retaining said members in said eyelets and said patch on the inner surface of said garment, said rings being retained on said members by the elastic stresses generated in said rings when placed on said members, said rings being removable from said electrically illuminatable members for permitting said electrically illuminable members and said patch containing said connector means and energization means to be detached from said garment.

2. Apparatus as claimed in claim 1 characterized in that said electrically illuminable members are disposed to project from the garment around the contour of a representation on said garment.

* * * * *